(12) United States Patent
Penberth et al.

(10) Patent No.: US 6,941,006 B1
(45) Date of Patent: Sep. 6, 2005

(54) METHOD AND SYSTEM FOR CALIBRATING THE SCAN AMPLITUDE OF AN ELECTRON BEAM LITHOGRAPHY INSTRUMENT

(75) Inventors: Michael J. Penberth, Cambridgeshire (GB); Graham S. Plows, Cambridgeshire (GB); Adam Woolfe, Cambridgeshire (GB)

(73) Assignee: DuPont Photomasks, Inc., Round Rock, TX (US)

( * ) Notice: Subject to any disclaimer, the term of this patent is extended or adjusted under 35 U.S.C. 154(b) by 0 days.

(21) Appl. No.: 09/262,778

(22) Filed: Mar. 4, 1999

Related U.S. Application Data

(60) Provisional application No. 60/076,879, filed on Mar. 5, 1998.

(51) Int. Cl.[7] .............................................. G06K 9/00
(52) U.S. Cl. ...................... 382/141; 382/190; 382/273; 348/87
(58) Field of Search ................................ 382/141, 190, 382/197, 266, 273; 348/208, 126, 87, 54, 348/536

(56) References Cited

U.S. PATENT DOCUMENTS

| | | | | |
|---|---|---|---|---|
| 4,481,666 A | * | 11/1984 | Niwa | 382/273 |
| 4,644,172 A | * | 2/1987 | Sandland et al. | 250/548 |
| 5,047,861 A | * | 9/1991 | Houchin et al. | 348/247 |
| 5,149,976 A | * | 9/1992 | Sipma | 250/492.2 |
| 5,260,779 A | * | 11/1993 | Wasserman | 348/126 |
| 5,345,085 A | * | 9/1994 | Prior | 250/491.1 |
| 5,393,987 A | * | 2/1995 | Abboud et al. | 250/492.22 |
| 5,468,969 A | * | 11/1995 | Itoh et al. | 250/492.23 |
| 5,526,044 A | * | 6/1996 | Tokumitsu et al. | 348/208 |
| 5,666,032 A | * | 9/1997 | Kresock | 315/370 |
| 5,677,743 A | * | 10/1997 | Terao et al. | 348/536 |
| 5,876,902 A | * | 3/1999 | Veneklasen et al. | 430/296 |
| 6,087,659 A | * | 7/2000 | Adler et al. | 250/310 |
| 6,274,290 B1 | * | 8/2001 | Veneklasen et al. | 430/296 |

OTHER PUBLICATIONS

IBM Techinical Disclosure Bulletin NN82112718, Nov. 1982, US vol. No. 25.*

* cited by examiner

Primary Examiner—Bhavesh M. Mehta
Assistant Examiner—Sheela Chawan
(74) Attorney, Agent, or Firm—DLA Piper Rudnick Gray Cary US LLP

(57) ABSTRACT

A method for calibrating the scan amplitude of an electron beam lithography instrument by determining the position of a feature within the scan. The method is effective at the operating frequency of the scan and using a limited bandwidth video signal including the steps of determining the reference feature to be an edge over which the video signal rises abruptly from a background level to a white level. The method turns the beam on only over a short region of the scan and represents the degree of overlap between the beam on portion of the scan and the white part of the feature as the total video signal accumulated in that scan.

5 Claims, 4 Drawing Sheets

METHOD AND SYSTEM FOR CALIBRATING THE SCAN AMPLITUDE OF AN ELECTRON BEAM LITHOGRAPHY INSTRUMENT

RELATED INFORMATION

This application claims priority under 35 U.S.C.§119(e)(1) to provisional application No. 60/076,879 filed on Mar. 5, 1998.

TECHNICAL FIELD OF THE INVENTION

The present invention relates to electron beam lithography methods and systems and, more particularly, to a method and system for calibrating the scan amplitude of an electron beam lithography instrument.

BACKGROUND OF THE INVENTION

The manufacture of electronic integrated circuits relies heavily on the use of image projection techniques to expose resist-coated wafers with light or X-rays. The patterns formed by this exposure determine the various circuit connections and configurations. In any exposure method, accuracy of the projected image is a prime consideration. This accuracy is particularly important in the manufacture of high density random access memories (RAM) in which the yield and ultimately the cost of the components depend heavily on meeting tight exposure placement requirements. With the increasing demand for high performance integrated circuits, the techniques to fabricate semiconductor substrates for microelectronic devices and other purposes have been undergoing continuous development and now include the use of scanning-electron beam lithography systems, both for producing high quality lithographic masks and for direct pattern generation.

Electron beam lithography systems use electron sources that emit electrons at all angles. The electrons are then constrained by the remainder of the system into a narrowly diverging beam. Succeeding lenses then focus the beam into one or more cross-overs before the beam reaches the target. In these systems, electron beams are formed by an electron beam column that, at a minimum, includes an electron source at an object plane and a target at the image plane. Usually the electron beam column includes at least an electron source at the object plane, one or more lenses, one or more apertures, and the target at the image plane. Columns for electron beam lithographic mask exposure include at least an electron source at the object plane, one or more lenses, one or more apertures, one or more deflectors, a set of beam blankers (which can be driven to stop the beam reaching the target), and a target at the image or mask plane.

In direct pattern generation where the electron beam system creates a pattern directly on a chip covered with resist material, the often complicated and time consuming mask-making process is eliminated. However, one of the key economic considerations in a direct electron beam lithography system for a production environment is the throughput achieved by direct writing relative to a system using a series of masks. This is of particular importance, because direct writing is necessarily a series output process. Hence, time constraints become even more critical in direct pattern generation.

As manufacturers seek ever higher writing speeds, other significant problems also appear. These problems arise often as a result of the relationship among these various parameters. For example, as the writing speed increases, the current density must be increased to maintain the same exposure on the resist. However, higher current densities lead to beam broadening due to electron—electron interactions, thereby deleteriously increasing the line width. Also, a shortened exposure time further requires a shortened blanking time, since the rise time of the blanker is closely related to the accuracy of the exposure of each pixel, and is also a major concern in avoiding extraneous exposure during blanking. Hence, blanking time in raster scan type electron beam devices remains one of the key factors limiting throughput.

Electron beam lithography systems use magnetic lenses to provide mainly radial acceleration and deceleration in focusing the beam, which is also at ground potential, at the target. The remainder of the column is held at ground potential unless more electrostatic lenses are used to make the electrons "drift," i.e., experience no electrical acceleration or deceleration through the remainder of the column.

The electron beam position is conventionally controlled via a technique called raster scanning. In this method, the electron beam is repeatedly deflected in a continuous series of ramp deflections and flyback periods similar to a scanning technique used in televisions. Typically, the electron beam is deflected as rapidly as possible to minimize the time required to completely expose a pattern. This increases the production rate (i.e. throughput) and lowers the unit cost per mask or wafer.

Conventionally, the deflection signal is measured by its product, i.e., the patterns on the mask or wafer. Non-ideal pattern placement seen on the mask or wafer is identified through a series of measurements and tests, and appropriate modifications are then made to the deflection signal to correct these deficiencies. This method of modifying the performance of the deflection signal relies heavily on standard procedures of writing a pattern, processing the mask or wafer, and then measuring the accuracy of the patterns with proven, but relatively slow, metrology techniques. This process may require from one hour for a simple calibration to several weeks for a full calibration.

Preferably, calibration is performed without invoking the time-consuming process of writing and reading actual exposures of masks and wafers. "Real-time" characterization of electron beam parameters is achieved by scanning the electron beam at very low frequencies over a reference grid with known positions. This technique is well-known in the art and provides sufficient information to functionally calibrate an electron beam lithography system.

However, the correlation between these low frequency measurements and the actual beam writing deflection signal is not exact. Specifically, the high frequency writing signal introduces several anomalies in the electron beam which require further characterization via extensive pattern writing and reading. These anomalies include deflection axis crosstalk, slight deflection axis rotation effects, gain differences, and scan offsets, all of which vary as a function of scan frequency.

One important aspect of calibrating scanning electron beam equipment such as scanning electron microscopes and raster scan electron beam lithography machines includes the calibration of the scan amplitude. This is commonly done by reference to the mechanical movement of the stage on which the sample or work piece is mounted. By identifying a feature on the sample and its position within the scan for two positions of the stage where the difference in stage position is known from some measuring device such as a laser interferometer the dimensions of the scan can be determined.

The bandwidth of the video detector chains used with these instruments is limited due to the low currents used in the electron beam. The scan amplitude is usually found to be scan frequency dependent. Reducing the scan rate to match the video bandwidth available results in calibration error at the higher scan rates.

SUMMARY OF THE INVENTION

In light of the above, a need exists for a method and system for calibrating the scan amplitude of an electron beam system such as an electron beam lithography system, that eliminates or reduces deflection axis crosstalk, slight deflection axis rotation effects, gain differences, and scan offsets.

A method for determining the position of a feature within the scan is needed which is effective at the operating frequency of the scan but uses a limited bandwidth video signal.

In accordance with the above-stated needs, the present invention provides a method and system that substantially eliminate or reduce disadvantages and limitations of prior electron beam blanking methods and systems, including the limitation requiring significant bandwidth video signals.

According to one aspect of the invention, there is provided a method for determining the position of a feature within the scan of an electronic beam that is effective at the scan operating frequency and that uses a limited bandwidth video signal. The method includes the steps of considering the reference feature to be an edge over which the video signal changes abruptly from one level to a higher or lower level. In the method, the electron beam is turned on only over a short region of the scan. The method represents the degree of overlap between the beam on portion of the scan and the higher video level part of the feature as the total video signal accumulated in that scan.

According to another aspect of the present invention, there is provided a method for determining the position of a feature within the scan that is effective at the operating frequency of the scan and that uses a limited bandwidth video signal. The method uses a sample having a video level transition as a reference feature. The method further includes the steps of unblanking the beam for a short period and advancing the unblanked period along the line by a small increment each succeeding period. Sampling the amplifier output by an analog-to-digital converter at a time delay following the unblank period determined by the video amplifier bandwidth is another step of the present invention. The method next involves arranging the successive samples for giving a video profile representative of the video profile of a slow scan with a wide beam. Mathematically processing the representative video profile to yield the position of the video edge with respect to the scan constitutes a final step of the method.

A technical advantage that the present invention provides is the calibration of the scan amplitude of an electron beam system that eliminates or substantially reduces deflection axis crosstalk, slight deflection axis rotation effects, gain differences, and scan offsets. The present method achieves these results by operating effectively at the operating frequency of the scan, while at the same time using a limited bandwidth video signal.

Another technical advantage provided by the present invention includes the ability to calibrate the scan amplitude of the scanning electron beam equipment but without the calibration errors that result at the higher scan rates. The present invention achieves this result by cross-correlating the results of two scans. The present method is independent of the exact feature profile of a scanned feature and is resistant to video noise in the profiles. The result yields a method of determining the position of a feature within the scan at the reduced or limited video bandwidth.

BRIEF DESCRIPTION OF THE DRAWINGS

For a more complete understanding of the present invention and the advantages thereof, reference is now made to the following description which is to be taken in conjunction with the accompanying drawings in which like reference numerals indicate like features and wherein.

DETAILED DESCRIPTION OF THE INVENTION

Preferred embodiments of the present invention are illustrated in the FIGUREs like numerals being used to refer to like and corresponding parts of the various drawings.

Figure 1:
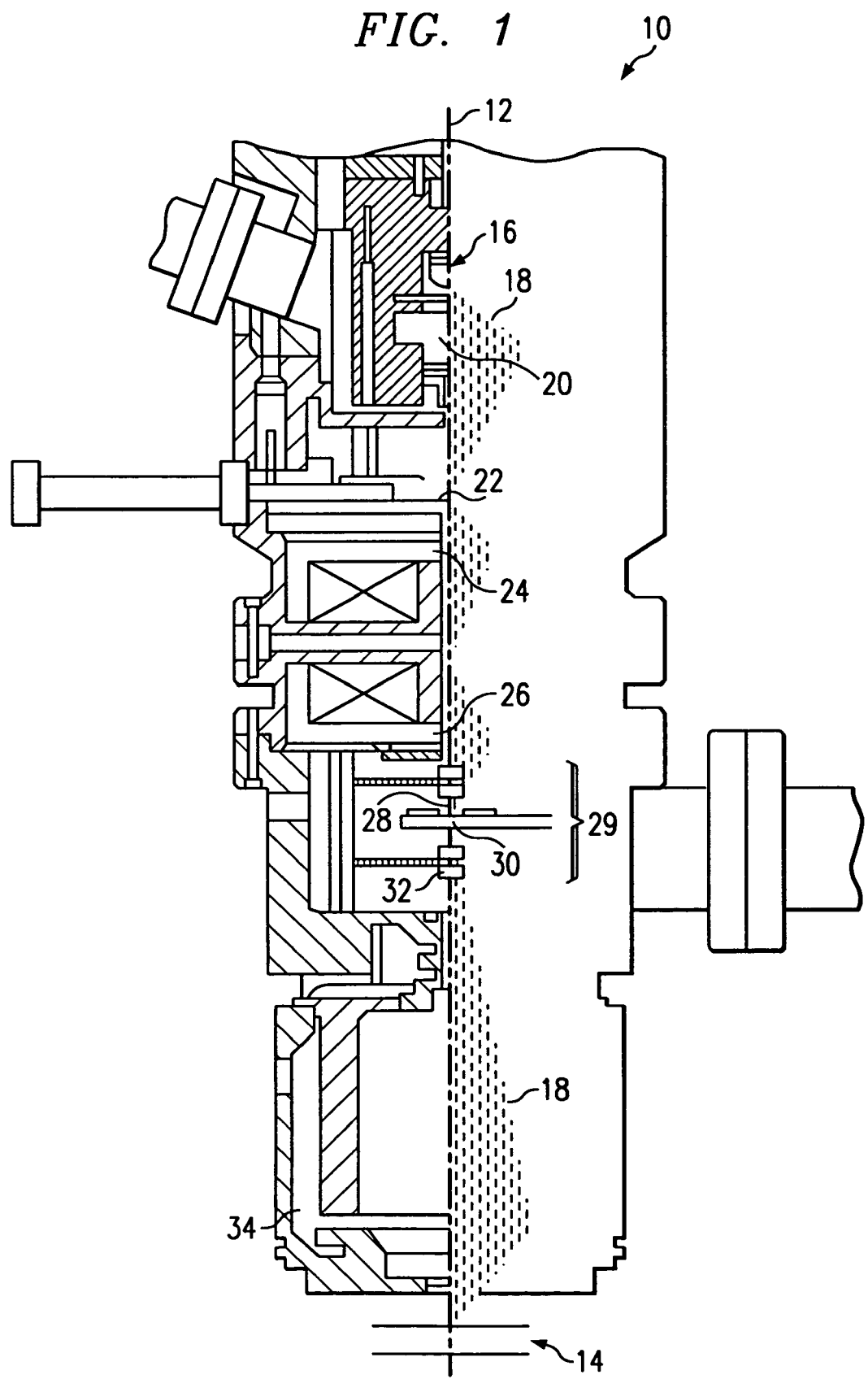
FIG. 1 shows a side cut-away schematic view of an electron beam lithography system incorporating the teachings of the present invention.

For general understanding of the invention, it is helpful to see the relationship for the blanker to the other elements of an electron beam lithography column. To that end, FIG. 1 shows a side cut-away schematic view of electron beam lithography system 10 incorporating the teachings of the present invention. Electrons are provided in the column by a cathode which is a thermal field emission electron source 16 much as described in U.S. Pat. No. 3,374,386 entitled FIELD EMISSION CATHODE HAVING TUNGSTEN MILLER INDICES 100 PLAIN COATED WITH ZIRCONIUM, HAFNIUM OR MAGNESIUM ON OXYGEN BINDERS, issued to Charbonnier, et al., in 1968. FIG. 1 shows only half of the column cross-section on the left-hand side of dash line 12. On the right-hand side of dash line 12 appears the electron beam divergence and convergence path enroute to target lithographic mask 14, however, with the lateral dimensions vastly exaggerated. The electron beam appearing in FIG. 1, therefore, is fairly realistic assuming that the lateral dimension is several thousand times the vertical dimension.

In FIG. 1, electron beam lithography system 10 includes high reliability thermal field emission tip 16 that emits a beam of electrons that eventually flow in the direction of lithographic mask 14. From thermal field emission tip 16, electron beam 18 passes through magnetic lens 20 which focuses the beam at the center of electron beam lithography system 10 and directs electron beam 18 through system limiting aperture 22. Aperture 22 further aligns electron beam 18 with the optical axis to provide the proper beam shape before electrons enter blanking device 29.

After passing through system limiting aperture 22, electron beam 18 goes through first magnetic lens 24 and then through second magnetic lens 26 until it reaches upper plates 28 of electron beam blanking device 29 of the present invention. Upper deflection plate set 28 deflects electron beam 18 through blanking aperture 30. From blanking aperture 30, electron beam 18 passes through lower deflection plates 32 of the present invention, which realigns electronic beam 18 upon its exit from blanking device 29.

Figure 2:
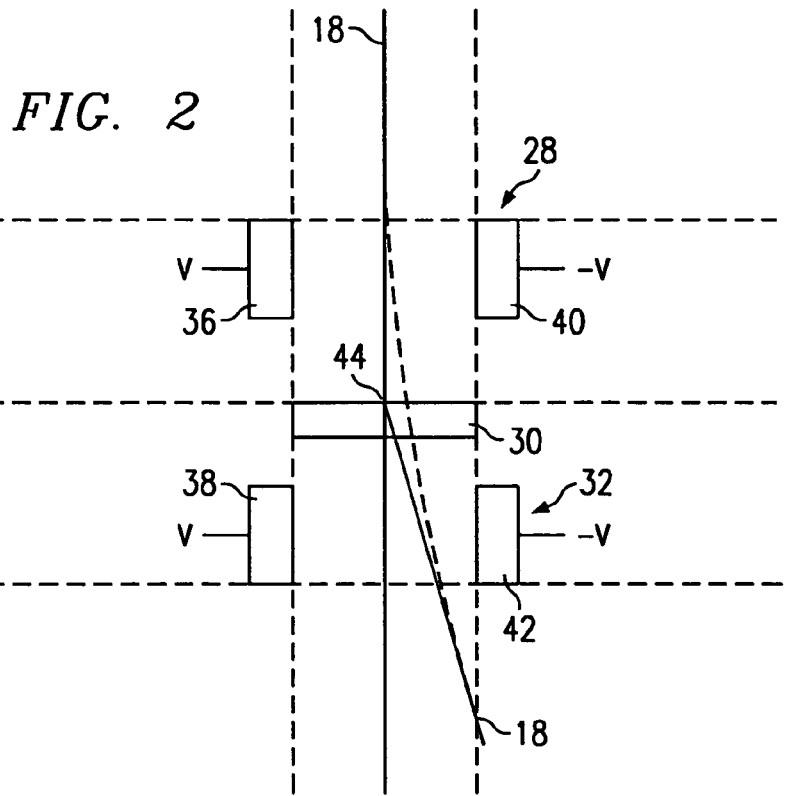
FIG. 2 illustrates conceptually the deflection function occurring in the present invention.

FIG. 2 illustrates conceptually the deflection and beam blanking function that blanking device 29 performs. In FIG. 2, an equal voltage, V(t), is driven first positively to upper plate 36 of upper plate set 28 and then to lower plate 38 of lower plate set 32. The deflection voltage, V(t), is the applied negatively to upper plate 40 of upper plate set 28 and lower plate 42 of lower set deflection plate 32. Blanking aperture 30 is placed midway between plate set 28 and lower plate set 32. This causes electron beam 18 to appear as though it emerges from point 44 of aperture 30 which is the axial point located centrally between the centers of upper deflection plate set 28 and lower deflection plate set 32. The blanking aperture 30 blanks electron beam 18 as soon as its deflection causes it to fall completely outside the blanking aperture opening. Until electron beam 18 is completely blanked, however, it appears, at all deflection angles, to emerge from blanking device 29 as though from blanking aperture 30.

Figure 3:
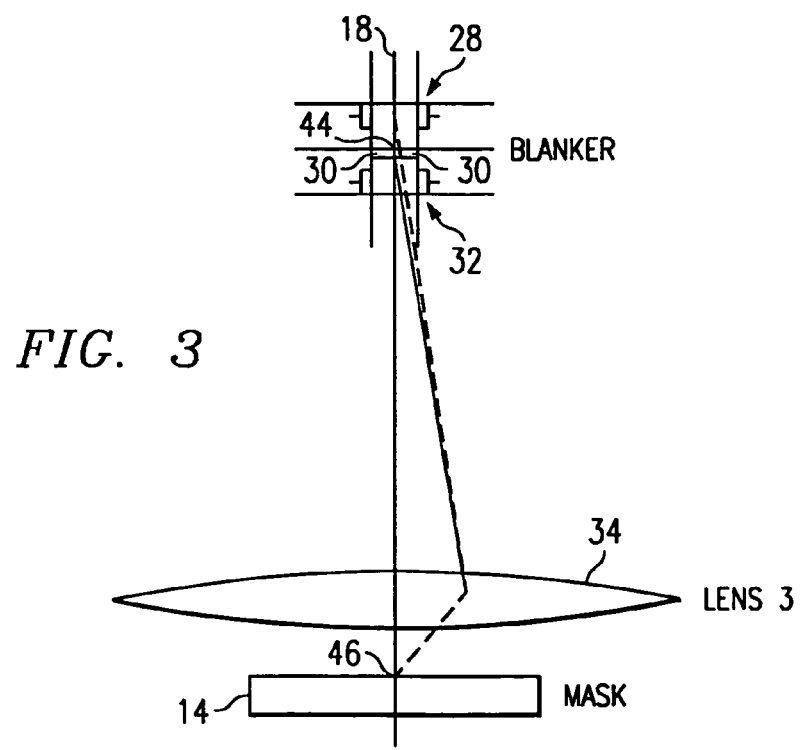
FIG. 3 depicts the magnetic focusing of an electron beam from the deflection system of the present invention to a lithographic mask for the purpose of electron beam lithography.

FIG. 3 depicts the magnetic focusing of electron beam 18 from electron beam lithography system 10 of the present invention to point 46 on lithographic mask. FIG. 3 illustrates an object of the present invention of assuring that the aperture 30 position is optically conjugate with the mask 14 surface so that point electron 46 on mask 14 remains stationary during blanking. Stated otherwise, the object at the blanking aperture is imaged at the mask 14 surface. Therefore, within the limits of a paraxial approximation of electron optics, any ray which appears to emerge from the blanking aperture is brought to the same image point in the mask plane, irrespective of the angle at which it emerges from lower deflection plate set 32.

U.S. patent application Ser. No., 09/261,594, entitled "ELECTRON BEAM BLANKING METHOD AND SYSTEM FOR ELECTRON BEAM LITHOGRAPHIC PROCESSING" filed on Mar. 3, 1999 by G. Plows, et al., and assigned to DuPont Photomasks, Inc. (hereinafter "Plows") describes a method and system that substantially improves blanking stability of an electron beam lithography system even at raster scan speeds of 300 MHZ and higher. The system of "Plows" include a first deflection plate pair deflects electrons flowing in the electron beam in the direction of the target lithographic mask. The first deflection plate pair includes a first tapered gap that is formed so that electrons which enter the first tapered gap before the initialization of a blanking voltage experience progressively greater electric field as they pass through the plates for controlling the cumulative deflection as the electrons travel through the first deflection plate pair. A second deflection plate pair further deflects electrons flowing in the electron beam in the direction of the target lithographic mask and includes a second tapered gap for further variably controlling the commutative deflection of the electron beam traveling through the second tapered gap. One or more hybrid integrated circuits provide deflection voltages to the first and second deflection plate pairs for varying the respective degree of electron beam deflection.

The present invention has application in such a system having improved methods of operation for raster scan operations. Accordingly, Plows is here expressly incorporated by reference to any and all extent necessary, including to the extent necessary to illustrate the preferred use of the present invention.

Within the context of the application as described in Plows, as well as in similar or different equipment capable of electron beam scanning operations, the present embodiment includes a method for determining the position of a feature during beam scanning that is effective at the scan operating frequency. The preferred embodiment uses a limited bandwidth video signal that samples to determine a video level transition as a reference feature. The method includes unblanking the beam for a short period and advancing the unblanked period along the line by a small increment in or succeeding sequential periods following one of more successive scans. The method further includes sampling the amplifier output by an analog-to-digital converter at a time delay following the unblank-blank period determined by the video amplifier bandwidth. The method then includes arranging the successive samples for giving a video profile representative of the video profile of a slow scan with a wide beam. Finally, the method includes mathematically processing the representative video profile to yield the position of the video edge with respect to the scan.

A system employing the teachings of the present invention considers the reference feature to be an edge over which the video signal changes abruptly from one level to a higher or lower level. The electron beam turns on only over a short region of the scan during the calibration. The total video signal accumulated in that scan then would represent the degree of overlap between the beam on portion of the scan and the higher video level part of the feature.

Figure 4:
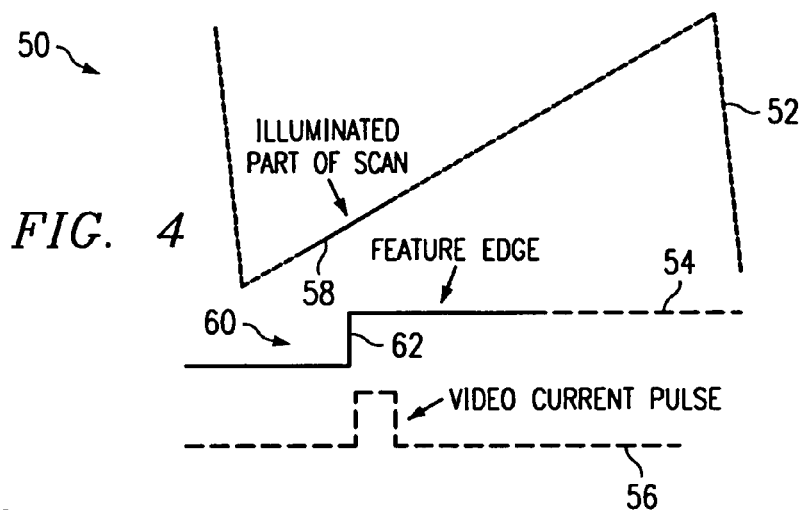
FIG. 4 shows a conceptual time-line drawing of the scan function that the present invention performs upon scanning a feature to generate a video current pulse.
Figure 5:
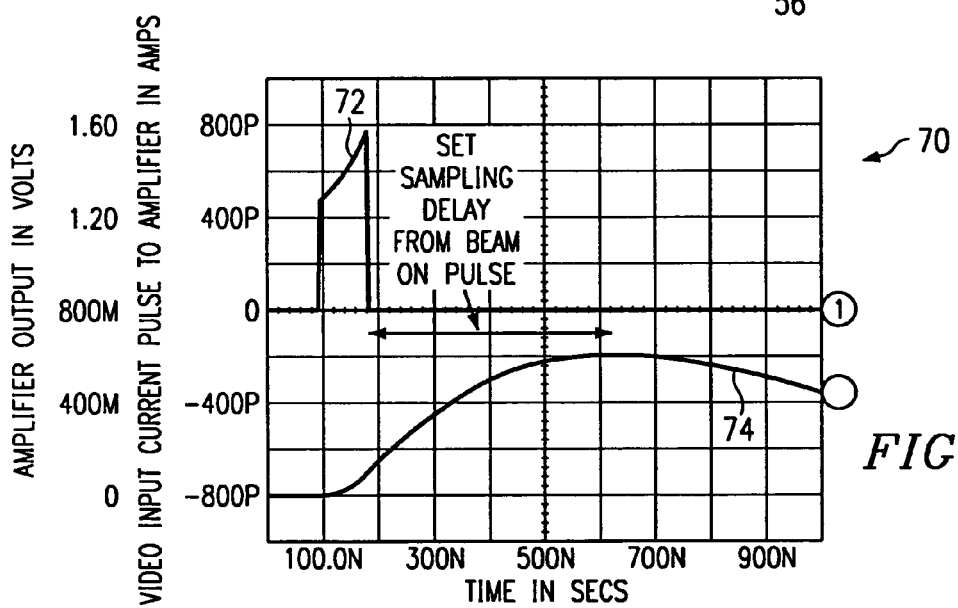
FIG. 5 depicts a response obtained from a video amplifier to illustrate the video signal obtained from an amplifier having a limited bandwidth with respect to the frequency content of the input signal.

FIG. 4 illustrates an important aspect of the present invention by showing a timing diagram 50 which illustrates the scan path 52 of the electron beam as the beam scans over feature 54 to generate the video current pulse 56. Video current pulse 56 arises from the overlap of the beam traveling through the illuminated part 58 of the scan with the high signal level region to the left of 62 on feature 54. The signal level rises at 62 to detect edge 60 of feature 54. Thus, rising at 62 to result of the video detector detecting edge 60. FIG. 5, in other words, shows the response obtained from a video amplifier having a slow frequency response compared with the video current pulse width. In FIG. 5, the maximum output from the associated amplifier occurs at a time delay after the video current pulse determined by the amplifier bandwidth and for a time which is long compared to the incremental resolution of the beam on pulse. If the video amplifier output is sampled with an analog-to-digital converter at a fixed delay after the beam on pulse the converter reading will correspond to the degree of overlap between beam on pulse and video edge.

The video amplifier will settle back to its blanked output level before the next scan. If the beam on pulse is advanced by a small amount along the scan for succeeding scans, the succession of converter values builds a video profile corresponding to that which would have been obtained with a slow scan and a bandwidth equal to the beam on pulse width.

Figure 6:
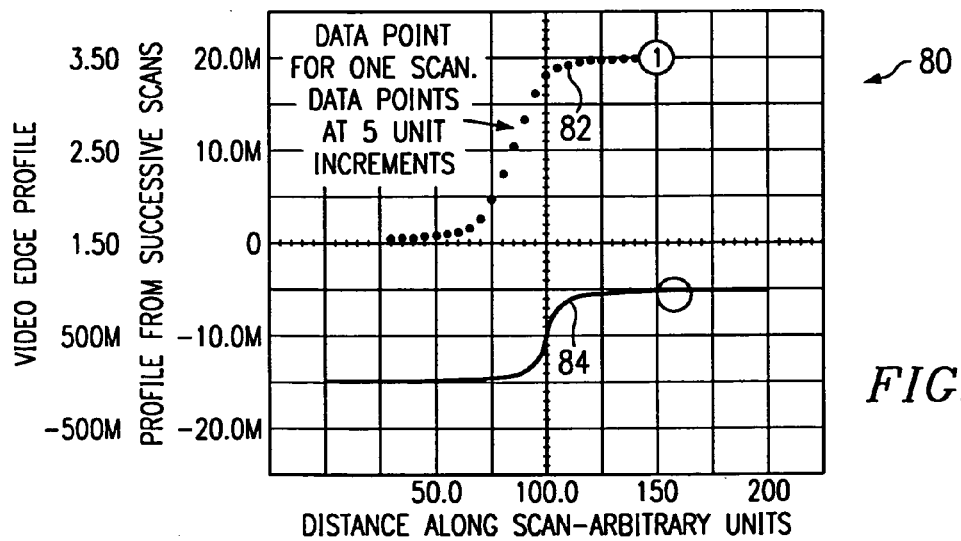
FIG. 6 illustrates results obtained by simulating the method of the present invention with a beam on pulse of 30 scan units width in 5 scan unit increments across a video edge with a profile represented in the lower trace.

FIG. 5 illustrates amplifier input and output illustrating the time delay that relates to the present invention. In particular, in plot 70 appears amplifier input 72 which is the video input current pulse to the video amplifier. Output 84 shows the amplifier output impulse. Thus, video input ranges from 0 to approximately 775 picoamps. Whereas, amplifier output ranges from 0 to approximately 600 millivolts. FIG. 6, therefore, provides a graph showing the results of simulating the method with a beam on pulse of 30 scan units width stepped in five (5) scan unit increments across a video edge with the profile represented in the lower trace. The calibration process requires that the position of a feature within one scan be compared with that in another scan following a repositioning of the mechanical stage or a change in some other beam deflection system. This is commonly achieved by recognizing some attribute of the video profile as having an absolute position along the scan. Such an attribute might be the point at which the video signal is halfway between its minimum and maximum values. Absolute positions so detected are then compared to give the apparent movement between scans.

The need to identify a feature attribute and define absolute positions in the scan may be avoided by carrying out a cross-correlation between the two scans. Cross-correlation may take a number of mathematical forms, one which the preferred embodiment uses is a least-squares correlation approach.

In understanding the preferred mathematical form, consider that each scan consists of a number of data points which may be numbered from 1 to N. Let $D1_n$ and $D2_m$ be the $n^{th}$ elements of the first and second scan respectively. The $m^{th}$ element of the cross-correlation function is then:

$$C_m = \sum_{n=j}^{k} (D1_n - D2_{(n+m)})^2$$

The value of m for which the cross-correlation is a minimum represents the difference between feature positions in the two scans in data points. Curve fitting to data points either side of the minimum allows for extrapolation of the minimum position to fractions of a data point.

FIG. 6 illustrates in graph 80 the video profile collected over successive scans for a video edge profile 84 corresponding to an edge such as edge 62 of device 54 in FIG. 4. In particular, curve 82 shows sequential data points for 25 successive scans with 5 scan unit increments between scans ranging from 0 to 20. Curve 84 shows the video edge profile ranging from 0 to 1. The horizontal axis of plot 80 represents the distance along the scan in arbitrary units that the detector moves across the edge, such as edge 62 of FIG. 4.

In summary, the method of the present invention uses a sample having a black-to-white or white-to-black video level transition as a reference feature. The beam is unblank-blanked for a short period during the scan. The unblank-blanked period is advanced along the line by a small increment each succeeding scan. At a time delay following the unblank-blank period determined by the video amplifier bandwidth, the amplifier output is sampled by an analog-to-digital converter. The successive samples are arranged to give a video profile representative of that which would have been obtained from a slow scan with a wide beam. Mathematical processing of two such successive profiles yields the amount of feature movement that has taken place between scans with respect to the scan field.

The present invention provides a novel aspect of stepping the "beam on" pulse. It is common in scanning electron beam equipment for the timing of beam blanking signals to be controlled by a digital clock signal such that a defined number of beam blanking switching points, or pixels, occur along the scan line. The data point separation and, therefore, the resolution of the cross-correlation measurement are determined by the step size by which successive beam on pulses are advanced along the scan line. This will normally be determined by the pixel size. The present invention improves upon this approach by providing a programmable delay which may be set between the blanking pulse generator and the beam blanker itself. This allows the beam on pulse to be advanced along the scan in sub pixel steps that are limited only by the resolution of the programmable blanking delay.

Figure 7:
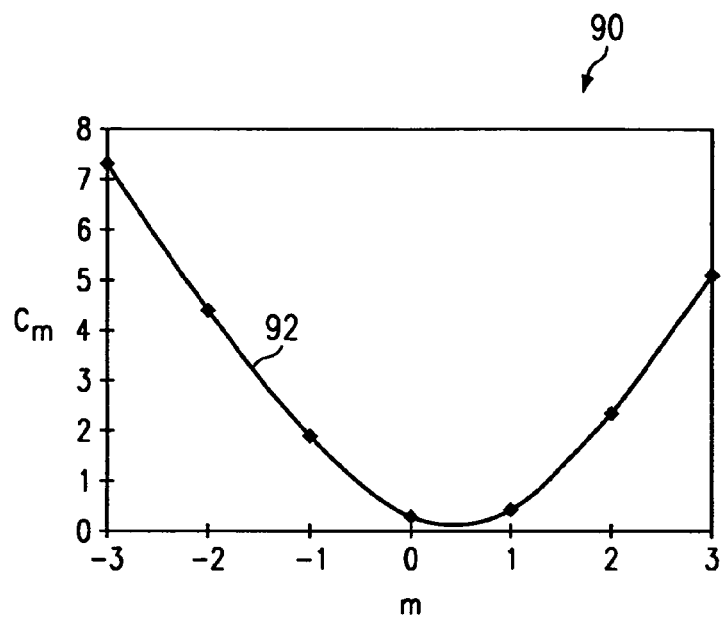
FIG. 7 depicts a plot of a cross-correlation function that one embodiment of the present invention may employ, representing the difference between feature positions in the two scans in data points.

FIG. 7 shows plot 90 that expresses along the vertical axis ranging from 0 to 8 with the value $C_m$. Along the horizontal axis is the measurement m ranging from −3 m to +3 m. Curve 92 begins at cross-correlation value of 7 and decreases to near 0.0 as the value m approaches a minimum value of approximately 0.4. Thereafter, $C_m$ increases to a level of approximately 5.0. Further advantages of using the cross-correlation technique between two scans is that it is independent of the exact feature profile and is resistant to video noise in the profiles.

Figure 8:
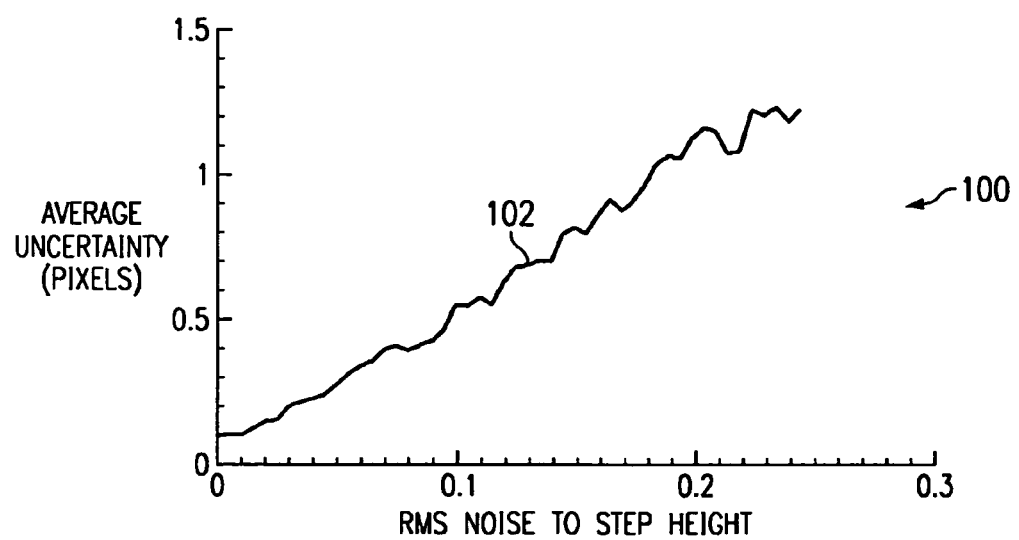
FIG. 8 shows the results of simulating the cross-correlation of the present embodiment in the presence of noise.

FIG. 8 shows the results of simulating the cross correlation approach used in the presence of noise. FIG. 8 illustrates in plot 100 the average uncertainty of pixels against RMS noise to step height along curve 102. Average accuracy of 0.5 pixels can be obtained with a 10-to-1 signal-to-noise ratio.

Although the invention has been described in detail herein with reference to the illustrative embodiments, it is to be understood that this description is by way of example only and is not to be construed in a limiting sense. It is to be further understood, therefore, that numerous changes in the details of the embodiments of the invention and additional embodiments of the invention, will be apparent to, and may be made by, persons of ordinary skill in the art having reference to this description. It is contemplated that all such changes and additional embodiments are within the spirit and true scope of the invention as claimed below.

What is claimed is:

1. A method for determining the position of a feature within a beam scan that is effective at an operating frequency of the scan and using a limited bandwidth video signal, comprising the steps of:
   determining the feature to be an edge over which the video signal changes abruptly from one level to a higher or lower level;
   determining whether the beam is only turned on over a short region of the scan; and
   representing degree of overlap between the beam on portion of the scan and the higher video level part of the feature as the total video signal accumulated in that scan.

2. A method for determining the position of a feature within a beam scan that is effective at the operating frequency of the scan and using a limited bandwidth video signal, comprising the steps of:
   using a sample having a black to white video transition as the feature;
   unblanking the beam for a short period;
   advancing the unblanked period along a line of the scan by a small increment in each succeeding scan;

sampling an amplifier output by an analog-to-digital converter at a time delay following the unblank-blank period determined by the video amplifier bandwidth;

arranging successive samples for giving a video profile representative of the video profile of a slow scan with a wide beam; and mathematically processing the representative video profile to yield the position of the video edge with respect to the scan.

3. A method of electronically measuring parameters of a beam in a raster scan system comprising the steps of:
   (a) choosing a predetermined plurality of pixels of said raster scan to be calibrated;
   (b) moving at least one feature at an image plane having video contrast adjacent to a landing point of said plurality of pixels;
   (c) strobing said beam for said plurality of pixels within said raster scan;
   (d) incrementally moving said plurality of pixels within said raster scan toward said at least one video contrast feature;
   (e) integrating the signal resulting from said plurality of pixels as said plurality of pixels move towards said at least one video contrast feature; and
   (f) repeating steps (c) through (e) until said plurality of pixels crosses said at least one video contrast feature.

4. In an electron beam equipment, a method for determining the dimensions of a beam scan of an electron beam by identifying a feature on a sample and a position of the feature within the scan for calibrating a scan amplitude, said method being effective at an operating frequency of the electron beam scan, but using a limited bandwidth video signal, comprising the steps of:

determining an edge over which the video signal changes from one level to a higher or lower level as the feature;

turning on the electron beam over only a short region of the electron beam scan; and representing as the total video signal accumulated a degree of overlap between the beam on portion of the scan and the higher video level part of the feature.

5. A method for determining the position of a feature within a beam scan that is effective at an operating frequency of the scan and using a limited bandwidth video signal, comprising the steps of:

determining the feature to be an edge over which the video signal changes abruptly from one level to a higher or lower level;

determining whether the beam is only turned on over a short region of the scan;

representing a degree of overlap between the beam on portion of the scan and the higher video level part of the feature as the total video signal accumulated in that scan;

unblanking the electron beam for a short period during the scan;

advancing the unblank-blanked period along a line of the scan by a small increment in each succeeding scan;

sampling a video amplifier output using an analog-to-digital converter at a time delay following the unblank-blanked period, said time delay determined by a bandwidth of the video amplifier; and stepping the unblank-blanked period along the line by sub pixel increments by inserting a programmable delay between a blanking pulse generator and a blanker itself.

* * * * *